US008288740B2

(12) United States Patent
Amador

(10) Patent No.: US 8,288,740 B2
(45) Date of Patent: Oct. 16, 2012

(54) METHOD FOR PREPARING SPECIMENS FOR ATOM PROBE ANALYSIS AND SPECIMEN ASSEMBLIES MADE THEREBY

(75) Inventor: Gonzalo Amador, Dallas, TX (US)

(73) Assignee: Omniprobe, Inc., Dallas, TX (US)

( * ) Notice: Subject to any disclaimer, the term of this patent is extended or adjusted under 35 U.S.C. 154(b) by 612 days.

(21) Appl. No.: 12/163,290

(22) Filed: Jun. 27, 2008

(65) Prior Publication Data
US 2009/0320624 A1 Dec. 31, 2009

(51) Int. Cl.
*G01D 21/00* (2006.01)
(52) U.S. Cl. ........... 250/492.21; 250/492.1; 250/492.2; 250/492.3; 73/105; 73/866.5; 850/1; 850/5; 850/63
(58) Field of Classification Search ............. 250/492.1, 250/492.2, 492.21, 492.3, 306, 307, 309, 250/310, 311, 440.11, 4, 42.11; 73/105, 73/866.5; 850/1, 5, 45, 63
See application file for complete search history.

(56) References Cited

U.S. PATENT DOCUMENTS

| | | | |
|---|---|---|---|
| 6,576,900 B2 | 6/2003 | Kelly et al. | |
| 6,717,156 B2 * | 4/2004 | Koike et al. | 250/440.11 |
| 6,927,391 B2 * | 8/2005 | Tokuda et al. | 850/10 |
| 6,956,210 B2 | 10/2005 | Doan | |
| 7,098,454 B2 | 8/2006 | Kuhlman et al. | |
| 7,157,702 B2 | 1/2007 | Gribb | |
| 7,423,263 B2 * | 9/2008 | Hong et al. | 250/304 |
| 2004/0056195 A1 * | 3/2004 | Kuhlman et al. | 250/307 |
| 2005/0178980 A1 * | 8/2005 | Skidmore et al. | 250/492.21 |
| 2005/0184236 A1 * | 8/2005 | Baur et al. | 250/311 |
| 2006/0091302 A1 * | 5/2006 | Moore et al. | 250/227.11 |
| 2006/0113476 A1 * | 6/2006 | Moore | 250/311 |
| 2006/0186336 A1 * | 8/2006 | Giannuzzi et al. | 250/307 |
| 2006/0219919 A1 * | 10/2006 | Moore et al. | 250/311 |
| 2006/0261270 A1 * | 11/2006 | Burkhardt et al. | 250/311 |
| 2007/0184515 A1 * | 8/2007 | Goodman et al. | 435/40.5 |
| 2008/0073535 A1 * | 3/2008 | Hong et al. | 250/311 |
| 2008/0156770 A1 * | 7/2008 | Munekane | 216/66 |
| 2008/0191151 A1 * | 8/2008 | Shichi et al. | 250/492.3 |

OTHER PUBLICATIONS

Miller et al., "Atom probe specimen preparation with a dual beam SEM/FIB miller", Ultramicroscopy, Feb. 23, 2007.*

(Continued)

*Primary Examiner* — Michael Logie
(74) *Attorney, Agent, or Firm* — John A. Thomas

(57) ABSTRACT

A method for making a specimen assembly for atom probe analysis in an energetic-beam instrument includes milling a post near a region of interest in a sample in the energetic-beam instrument, so that the post has a free end. The probe tip of a nano-manipulator probe shaft is attached to the free end of the post and the post is cut free from the sample to form a rough specimen, so that the region of interest in the rough specimen is exposed at approximately the location where the post is cut from the sample. A specimen assembly form is provided having an open area inside its perimeter. The probe shaft bearing the specimen is joined to the specimen assembly form, so that the region of interest in the rough specimen is located in the open area. Thereafter, the probe shaft can be cut off outside the perimeter of the specimen assembly form, and the specimen conveniently held and sharpened for atom probe analysis. Specimen assembly forms made by the method are also disclosed.

23 Claims, 6 Drawing Sheets

OTHER PUBLICATIONS

Gorman, Brian P., 3rd Advanced Materials/Failure Analysis Workshop, UNT Materials Science and Engineering, AMFA 2008, May 2, 2008.

K. Thompson et al, In situ site-specific specimen preparation for atom probe tomography, ScienceDirect, Jun. 16, 2006, pp. 131-139, Ultramicroscopy 107 (2007).

Muneyuki Fukuda et al, A new FIB fabrication method for micropillar specimens for three-dimensional observation using scanning transmission electron microscopy, Journal of Electron Microscopy53(5): 479-483 (2004).

Michael J. Vasile, Focused ion beam technology applied to microstructure fabrication, pp. 2499-2505, J. Vac. Sci. Technol. B 16(4), Jul./Aug. 1998.

S. R. Claves et al, Using a Focused Ion Beam (FIB) Instrument to Investigate the Three-Dimensional; (3D) Morphology of B-AlFeSi Intermetallic Particles, pp. 1334-1340, Materials Forum vol. 28, published 2004.

Ampere A. Tseng, Recent developments in micromilling using focused ion beam technology, pp. R15-R34, Journal of Micromechanics and Microengineering, Jan. 19, 2004.

* cited by examiner

METHOD FOR PREPARING SPECIMENS FOR ATOM PROBE ANALYSIS AND SPECIMEN ASSEMBLIES MADE THEREBY

TECHNICAL FIELD

This disclosure relates to the analysis of specimens with an atom probe microscope or similar analysis, such as electron tomography; in particular, it deals with the preparation of specimens and specimen holders suitable for such analysis.

BACKGROUND

The atom probe (also referred to as an atom probe microscope or local electrode atom probe) is a device that allows specimens appropriately sized or taken from larger samples, such as semiconductor wafers or large parts thereof, to be analyzed on an atomic level. In a basic version of an atom probe a specimen mount is spaced from a detector, generally a microchannel plate and delay line anode. A specimen is situated in a specimen mount, and the voltage of the specimen holder is adjusted relative the voltage of the detector such that atoms on the specimen's surface ionize, evaporate from the specimen's surface, and travel to the detector. Generally, the voltage of the specimen is pulsed so that the pulses trigger evaporation events with the timing of the pulses, thereby allowing at least a rough determination of the time of evaporation. Measurement of the time of flight of the ionized atoms from the specimen to the detector allows determination of the mass-to-charge ratio of the ions, and thus the identity of the evaporated atoms. Measurement of the location at which the ions impinge on the detector allows determination of the relative locations of the ionized atoms as they existed on the specimen. Thus, over time, one may build a three-dimensional map of the identities and locations of the constituent atoms in a specimen.

Owing to the number of atoms potentially contained in a specimen, and the time required to collect these atoms, specimens are usually taken as a part of a larger object (called the "sample" here). Such specimens are often formed by removing a section or wedge from the sample that represents the structure of the sample throughout at least a portion of its depth. Such a specimen is typically attached to a pre-made post and then sharpened by ion milling. The specimen-post combination is then aligned in a specimen holder with its axis extending toward the detector, so that the collected atoms demonstrate the depthwise structure of the sampled object. The rod-like structure of the prepared specimen also beneficially concentrates the electric field of the charged specimen about its apex (its area closest to the detector), thereby enhancing evaporation from the apex.

Methods in the prior art are directed to the analysis of the atomic structure at the apex of the specimen, as removed from the sample. If the structure of the specimen that is of interest is located at the base of the specimen core, that is, opposite to the apex, there is presently no simple method to quickly prepare that region for analysis in an atom probe instrument. Known methods involve attaching and then detaching a probe tip to the specimen and attaching the specimen to a post. It would be advantageous if the steps of providing a pre-made post and then mounting a specimen upon it by detaching it from a probe tip could be eliminated. The present disclosure solves this problem by making the specimen and the post the same object. Further, prior-art techniques usually require ex-situ deposition of additional layers (such as Pt) to preserve the top layer of the sample from which the specimen is taken, and it would also be advantageous to omit this step if the region of interest is below the surface. Even if it is desired to deposit a protective layer over the sample to protect adjacent regions, it would be preferable to do so in-situ.

DRAWINGS

In the figures, a scale may be indicated to give the reader the approximate magnification of the configuration depicted. The various dimensional relationships shown are not necessarily exact or to scale.

DESCRIPTION

Figure 1:
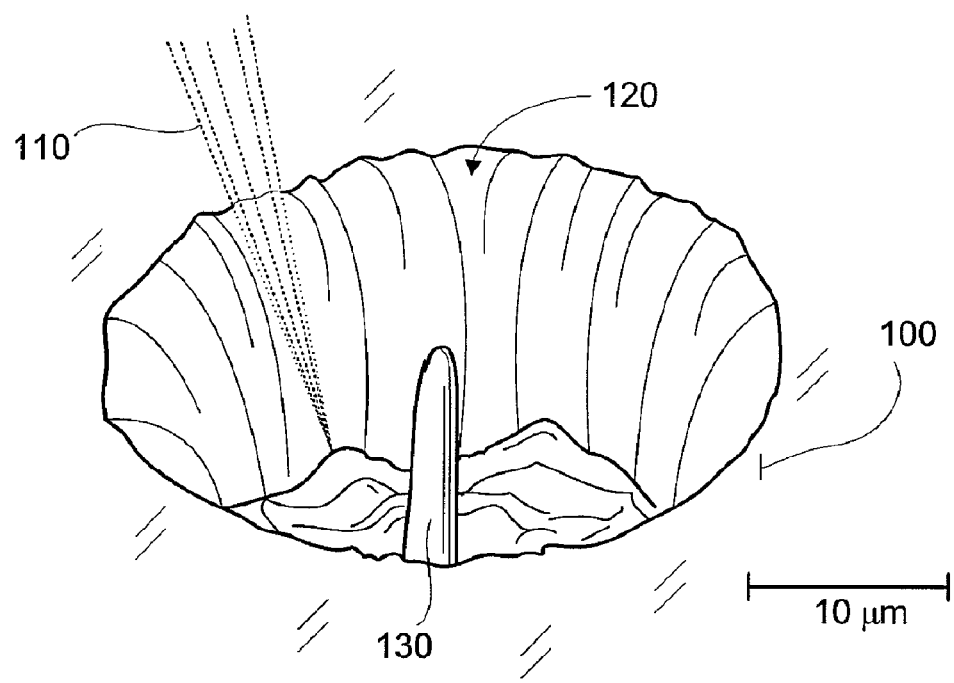
FIG. 1 depicts a post as milled from a sample surface.

FIG. 1 depicts a post (130) milled from a sample surface (100) located inside an energetic-beam instrument. Such instruments are commonly called "focused ion-beam" (FIB) microscopes, but the term "FIB" or "energetic beam instrument" is used in this disclosure to refer to any vacuum instrument where the "milling" may be accomplished by an energetic beam (110), such as an ion beam, an electron beam, or a laser beam.

The location of the post (130) is chosen at an area of interest in the sample surface (100), and an excavation (120) is milled out to leave the post (130) containing the area of interest (170) in the base of the post (130) still integral with the sample (100).

Figure 2:
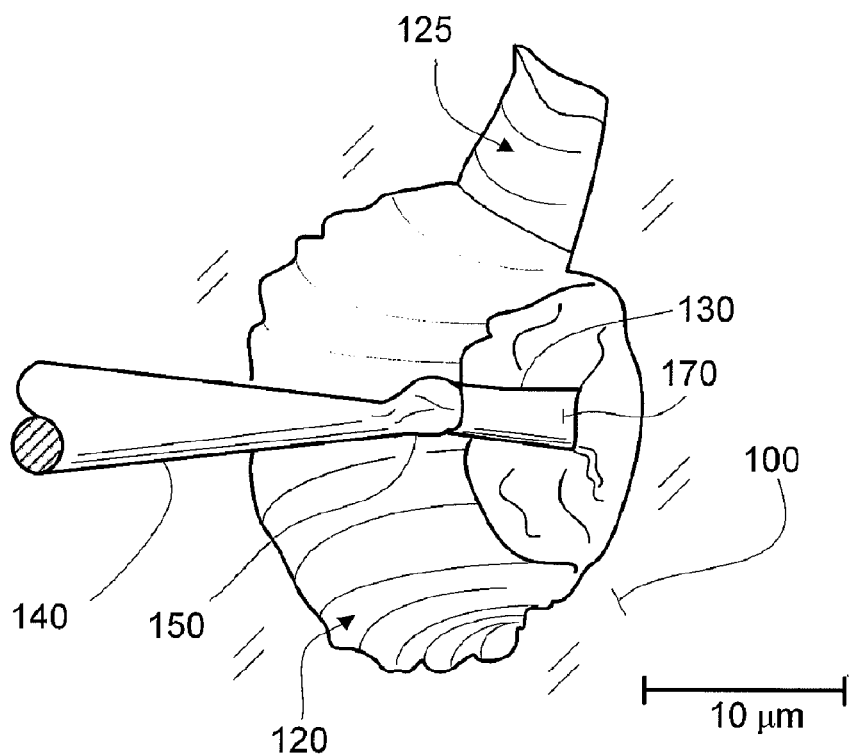
FIG. 2 depicts the same post and sample surface re-oriented, with a probe tip attached to the post.

In the operation shown in FIG. 2, the probe tip (140) of a nano-manipulator probe system is moved to the location of the post (130). The Omniprobe Model 200 nano-manipulator, manufactured by Omniprobe, Inc. of Dallas, Texas, is suitable. The specimen surface (100) is tilted or rotated, or both, from its previous orientation relative to the milling beam, to substantially align the longitudinal axes of the post (130) and the probe tip (140). The probe tip (140) is then attached to the free end of the post (130). This attachment (150) would typically be made by welding with chemical-vapor deposition, but could also be made by means known in the art for fixing nano-scale objects, such as adhesives, electron beam deposition, laser soldering or thermal soldering.

Figure 3A:
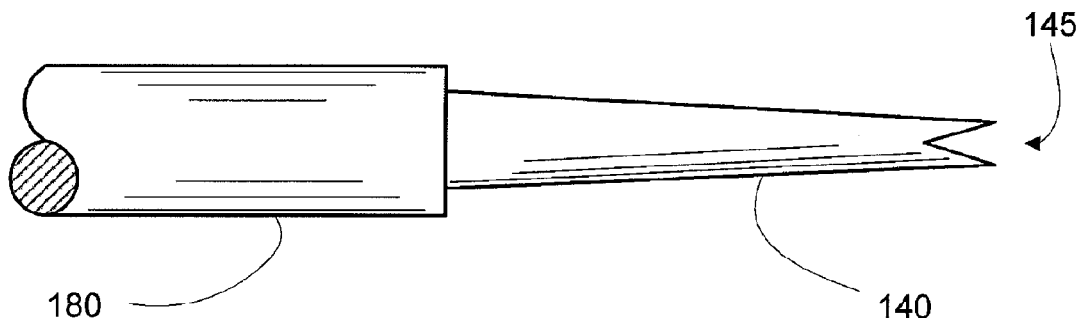
FIG. 3 depicts improved probe tips.
Figure 3B:
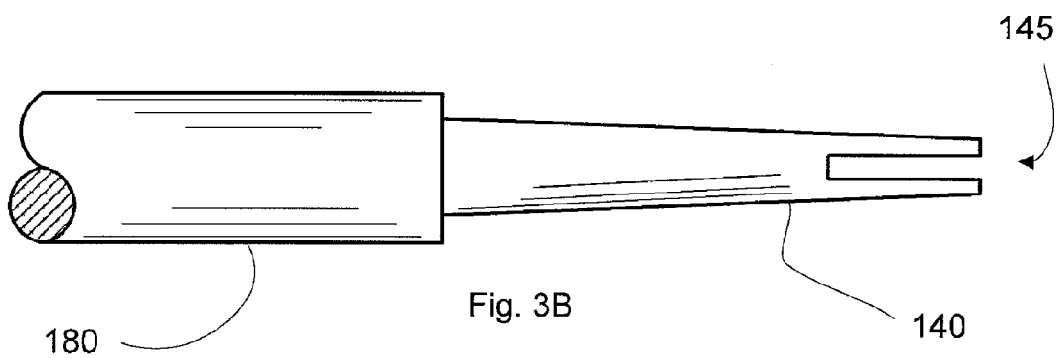

Preferably, the end (145) of the probe tip (140) is previously milled to form a "V" shape or slot, as shown in FIGS. 3A and 3B. Such a shape aids in visual alignment of the probe tip (140) with the post (130), and also provides a more robust weld attachment to the post. The reader should understand that the "probe tip" (140) referred to in this application is not limited to the typical tungsten-needle probe tip, but may, as illustrated, have cuts, slots, fingers or other configurations that would assist attachment of a specimen. Further, the probe tip (140) need not be made of tungsten, and need not be homogeneous, if another material would be advantageous in a particular application.

Figure 4:
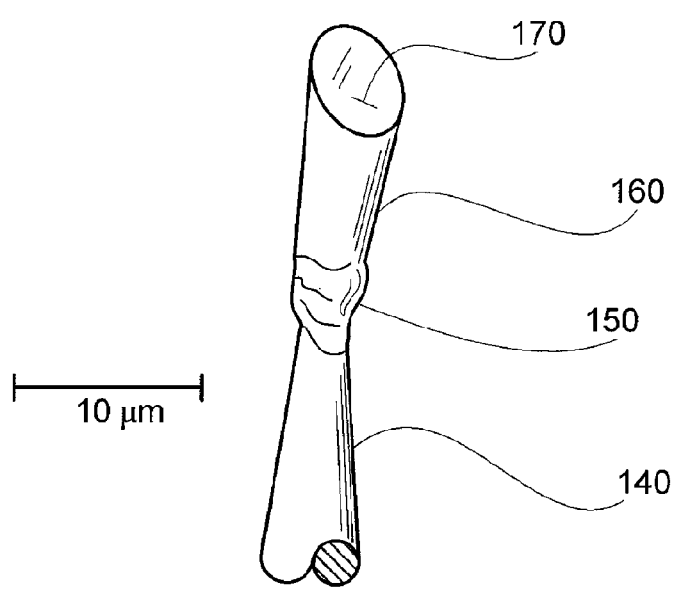
FIG. 4 depicts a rough specimen attached to a probe tip and separated from the sample.

The base region (170) of the post (130), being the region of interest, is then cut free from the sample (100), preferably using an energetic beam (110) in the FIB. A trench (125) may be milled at the edge of the excavation (120) to provide access for the cutting beam (110), or, the entire excavation (120) may be undercut by milling, thus releasing the post (130). In any case, FIG. 4 shows the resulting structure, where the now detached rough specimen (160) is held to the probe tip (140) at the point of attachment (150), thereby exposing the region of interest (170) on the backside of the rough specimen (160).

Atom probe analysis works best with a direct electrical path from the voltage source to the region of interest. If there is a non-conducting layer between the voltage source and the region of interest, then analysis will often fail because of dielectric breakdown and resulting specimen fracture. The backside approach we describe allows the poorly conducting regions to be placed above the region of interest (with respect to the atom probe voltage source), and thus improves the yield of the atom probe analysis.

Figure 6:
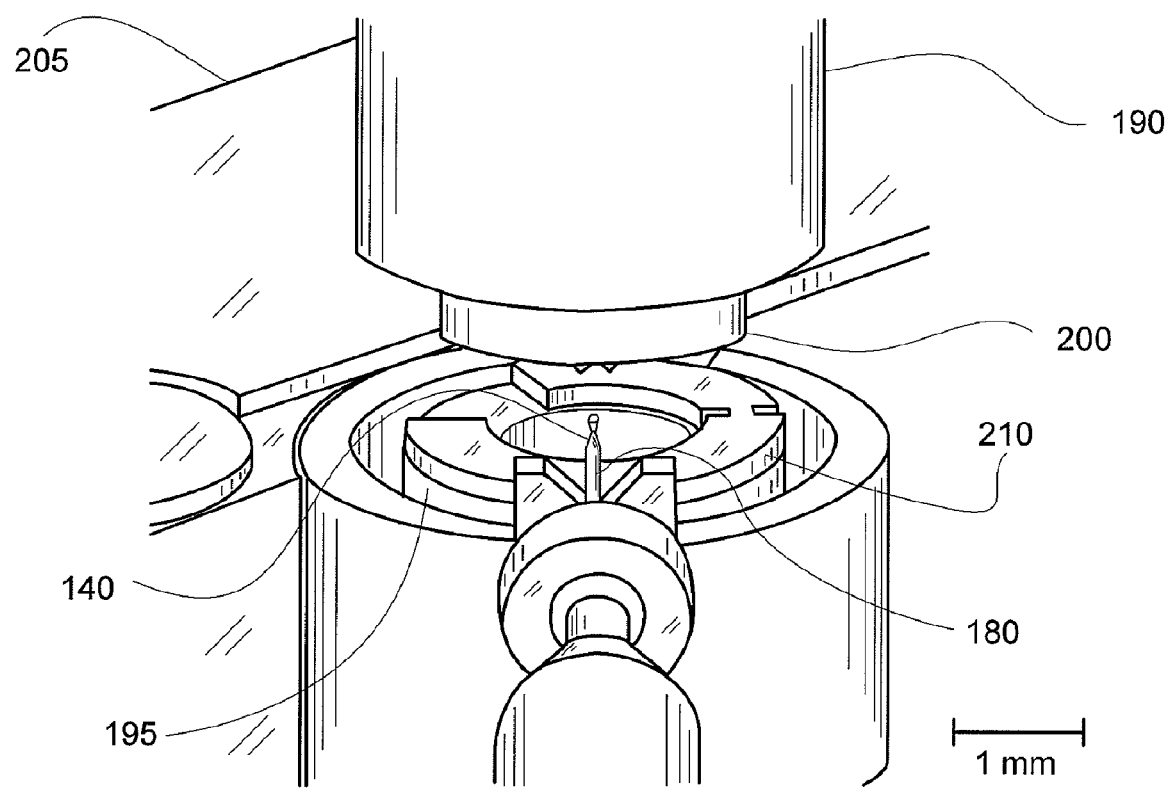
FIG. 6 depicts a probe bearing the probe tip with attached rough specimen placed within a press, to be bonded to a specimen assembly form.

It is advantageous to securely fasten the joined probe tip (140) and the rough specimen (160) to a structure that will support and retain both while the region of interest (170) is further sharpened for atom probe inspection. FIG. 6 shows a method to join the probe tip (140) to such a structure, in this case, a coupon (205), by pressing the probe shaft (180) portion of the probe tip (140) into a portion of the coupon (205) with a press (190). The press (190) has a former rod (200) that grips the probe shaft (180) and holds it in alignment until sufficient pressure has been applied. FIG. 6 depicts the operation just described.

A suitable press (190) and former rod (200) assembly, along with suitable actuating means, is the Omniprobe Short-Cut, manufactured by Omniprobe, Inc., of Dallas, Tex. The operation of such a press (190) is generally described in U.S. Pat. No. 7,126,132, titled "Apparatus for preparing a TEM sample holder," the disclosure of which is incorporated by reference into this present application. In the incorporated disclosure, the part corresponding to the coupon (205) in this application was called a "TEM sample holder coupon." A "TEM sample holder" corresponding to the specimen assembly form (210) of this application was formed by pressing a probe shaft into the TEM sample holder coupon and cutting away surplusage, leaving a "TEM sample holder" with a probe shaft embedded in it.

Figure 5:
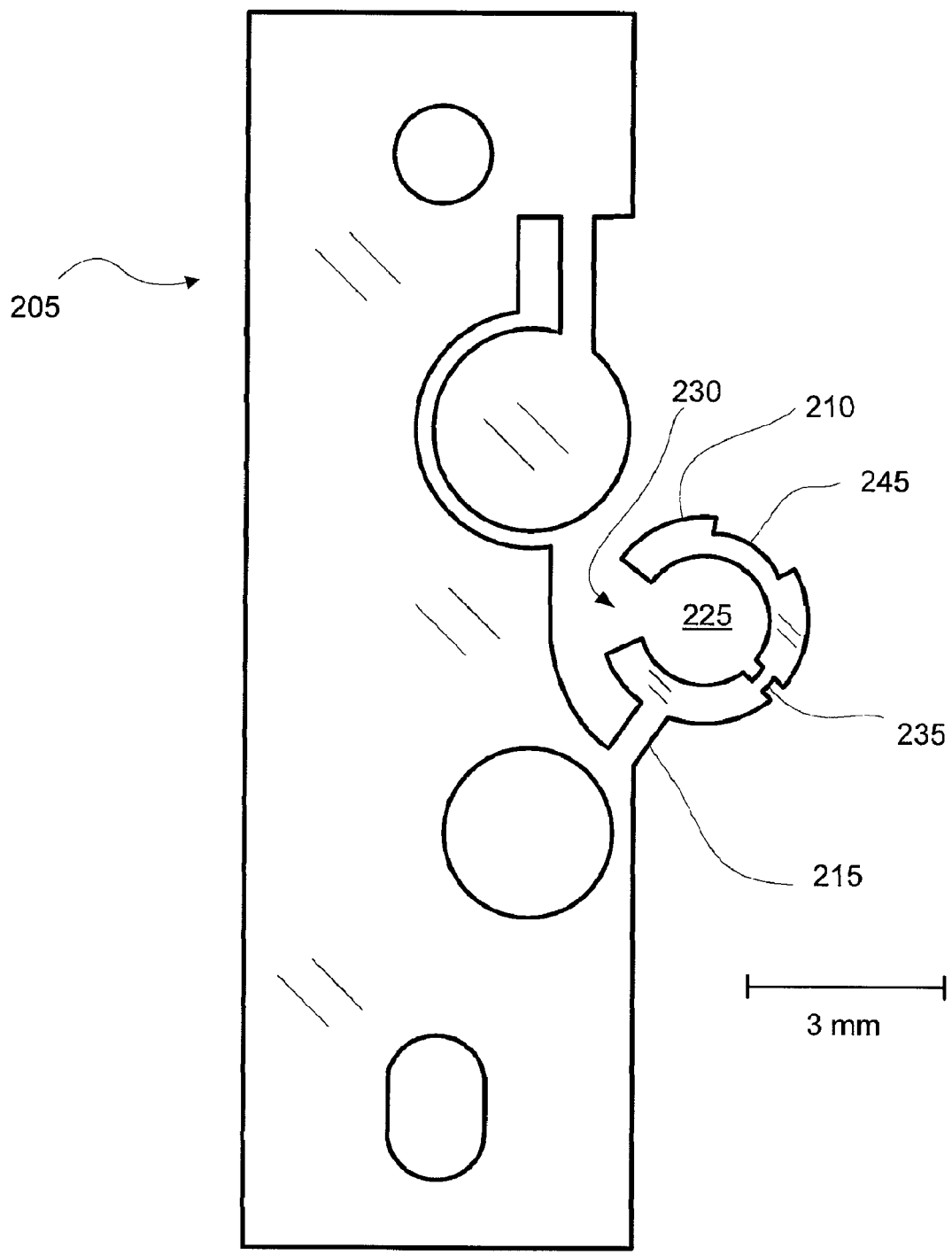
FIG. 5 shows a plan view of a coupon suitable for obtaining specimen assembly forms.

FIG. 5 shows a coupon (205) adapted for preparing a specimen assembly (220) for analysis. The coupon (205) is preferably a sheet of soft copper, but it may also be made of molybdenum, aluminum, gold, silver, nickel or beryllium, if appropriate to the application. A specimen assembly form (210) extends from the body of the coupon (205) by a tab (215). The specimen assembly form (210) has the shape of a ring or other open geometric form. The tab (215) is severed in the pressing operation described below. The specimen assembly form (210) preferably has a mouth (230), allowing access to its open area (225). (The coupon (205) may have other holes or features for mounting and aligning in the press (190), as described in the incorporated patent.)

The pressing operation joins the probe shaft (180) to the specimen assembly form (210) by plastic flow of the coupon (205) material between the former rod (200) and the anvil (195) of the press (190). In the embodiment shown, the form (210) has an area of diminished width (245) to aid cutting of the probe shaft (180) at the outside perimeter of the form (210). The form (210) further has an area of weakness (235) for breaking, as next described. The probe shaft (180) is aligned so that the rough specimen (160) on the probe tip (140) is inside the perimeter of the specimen assembly form (210), preferably in or near the geometrical center of the open area (225) of the specimen assembly form (210)

Figure 7:
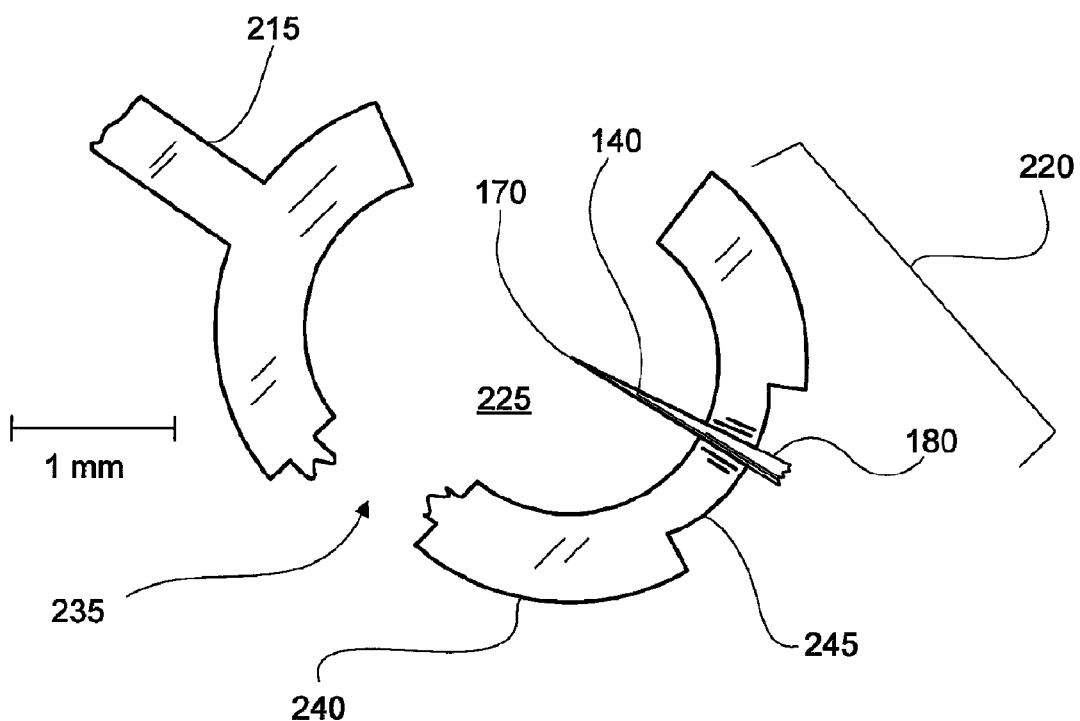
FIG. 7 shows a view of a specimen assembly comprising the specimen assembly form with the probe shaft and probe tip bearing the rough specimen bonded to the specimen assembly form.

FIG. 7 shows the resulting specimen assembly (220) of the present disclosure, where the form (210) has been separated from the coupon (205) at the tab (215), and the semi-circular portion (240) of the form (210) having the attached probe tip (140) is broken free from the portion of the form (210) connected to the tab (215). The semi-circular portion (240) is preferably broken manually with tweezers at the area of weakness (235). If desired, the press may be configured so as not to separate the tab (215) from the coupon (205), and the semi-circular portion (240) may be broken free and separated from the form (210) while the form (210) is still attached to the rest of the coupon (205). The completed specimen assembly (220) thus securely holds the rough specimen (160) for sharpening and for analysis in an atom probe instrument.

Different shapes may be used for the specimen assembly form (210), such as squares or ovals, although it is convenient to make the form (210) in the circular shape of a conventional 3 mm TEM grid. Also, other means besides mechanical deformation may be used for joining the probe tip (140) to the specimen assembly form (210), such as electrical or thermal bonding, adhesives, chemical vapor deposition, or corrugations in the coupon (205) to assist gripping by mechanical deformation.

Figure 8:
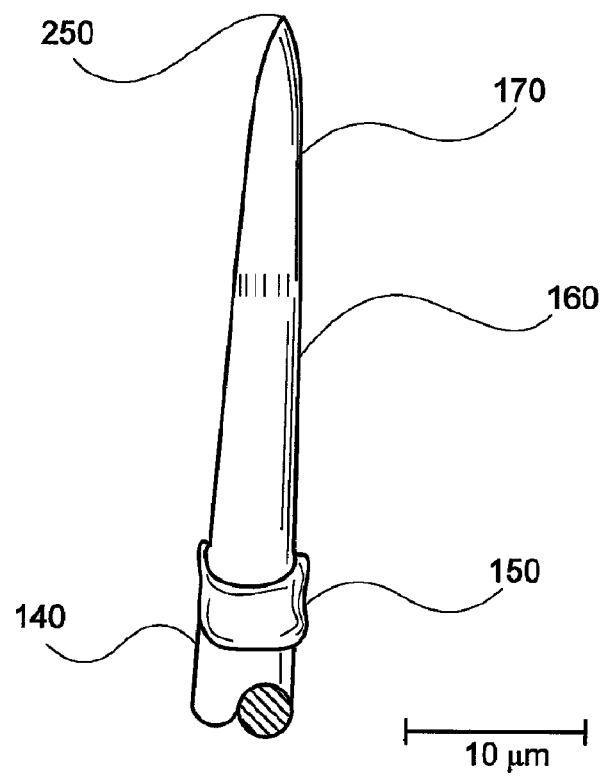
FIG. 8 shows the sharpened tip of a specimen ready for atom probe analysis.

The completed specimen assembly (220) can then be placed in the FIB and the rough specimen (160) milled to form the sharp tip (250) required for atom probe analysis. FIG. 8 shows part of an exemplary specimen assembly (220) where milling from the region of interest (170) of the rough specimen (160) has been completed, creating the desired sharp tip (250).

Figure 9:
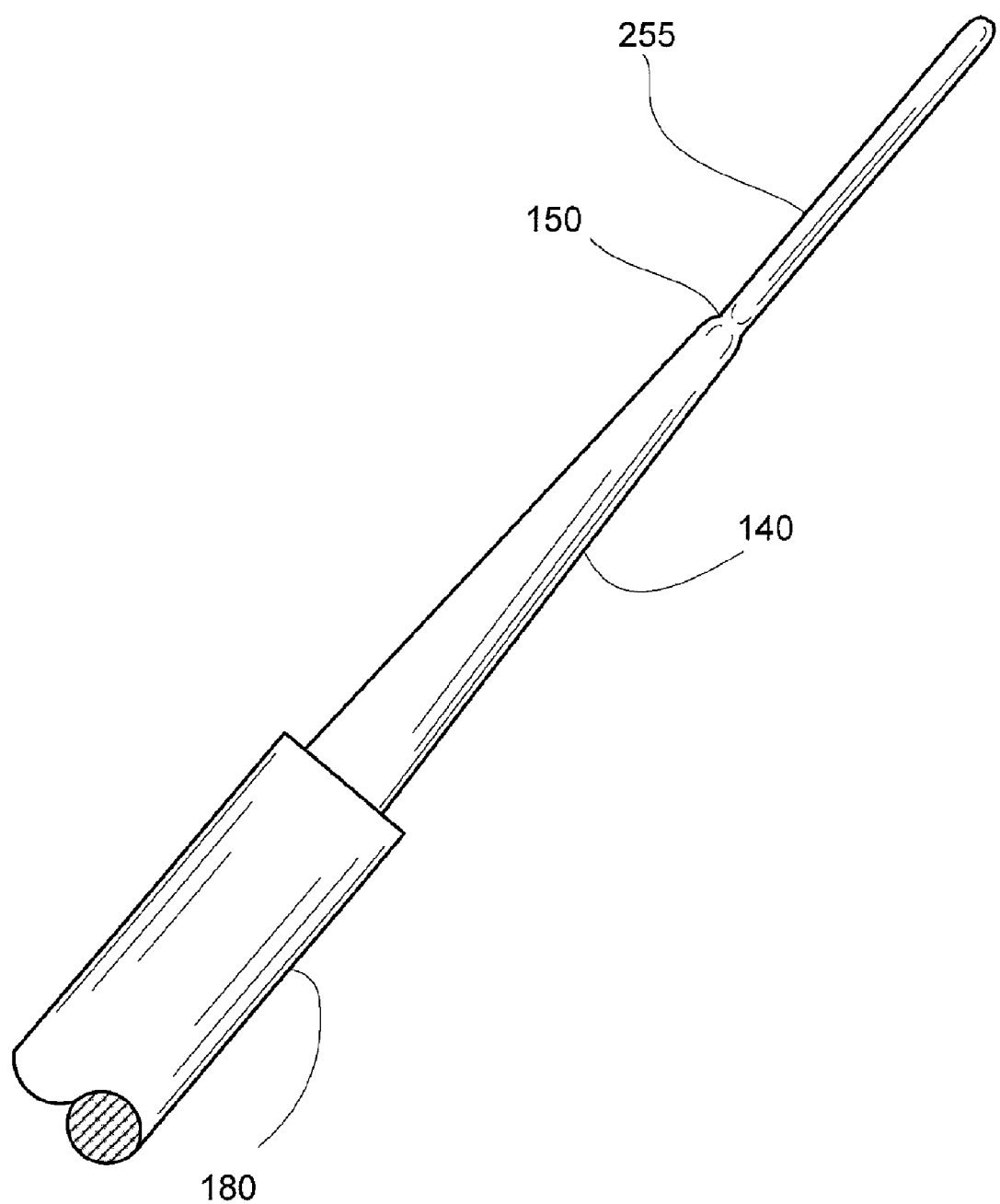
FIG. 9 shows a nanowire specimen attached to a probe tip.

The reader should note that the disclosed specimen assembly (220) could also be used to secure probe tips (140) that are attached to small particles. Particles that generally will not require sharpening before atom probe analysis are those having an aspect ratio greater than unity and further having at least one dimension smaller than about 100 nm. Typical such particles would be nanorods or nanowires. These particles can be attached to a probe tip (140) that is then joined with a specimen assembly form (210) to form a specimen assembly (220). FIG. 9 shows a nanowire (255) attached to a probe tip (140). The manipulation of small particles is discussed in U.S. Pat. No. 6,777,674 B2, titled "Method for manipulating microscopic particles and analyzing," the disclosure of which is incorporated by reference into this present application.

After sharpening, the specimen assembly (220) may be mounted in an atom probe instrument, such as that manufactured Imago Scientific Instruments Corp. of Madison, Wis. Mounting adaptors for holding various embodiments of the specimen assembly (220) in various atom probe instruments may be obtained from Hummingbird Scientific, LLC of Lacey, Wash.

We claim:

1. A method for making a specimen assembly for atom probe analysis, the method comprising:
    in an energetic-beam instrument, milling a post near a region of interest in a sample, so that the post has a free end and a base and a longitudinal axis;

tilting the sample so as to substantially align the longitudinal axis of the post with the axis of the probe tip of a nano-manipulator probe shaft; thereafter, attaching the probe tip to the free end of the post; thereafter, cutting the post free from the sample at the base to form a rough specimen, so that the region of interest in the rough specimen is exposed at approximately the base of the post;

providing a specimen assembly form; the specimen assembly form having an open area inside its perimeter;

joining the probe shaft to the specimen assembly form, so that the region of interest in the rough specimen is located in the open area; and, cutting off the probe shaft outside the perimeter of the specimen assembly form.

2. The method of claim 1, further comprising sharpening the rough sample at the region of interest to permit atom probe analysis.

3. A specimen assembly for atom probe analysis, the specimen assembly constructed according to the method of claim 2.

4. The method of claim 1, where the probe tip is attached to the post by chemical vapor deposition.

5. A specimen assembly for atom probe analysis, the specimen assembly constructed according to the method of claim 4.

6. The method of claim 1 where the step of joining the probe shaft to the specimen assembly form is performed outside the energetic-beam instrument.

7. A specimen assembly for atom probe analysis, the specimen assembly constructed according to the method of claim 6.

8. The method of claim 1 where the step of joining the probe shaft to the specimen assembly form further comprises:
applying pressure to probe shaft and the specimen assembly form so as to cause plastic flow of the specimen assembly form material about the probe shaft.

9. A specimen assembly for atom probe analysis, the specimen assembly constructed according to the method of claim 8.

10. The method of claim 1 where the step of joining the probe shaft to the specimen assembly form further comprises:
aligning the probe shaft so that the attached rough specimen is situated approximately at the geometrical center of the open area of the specimen assembly form.

11. The method of claim 1 further comprising:
providing a coupon, where the coupon comprises the specimen assembly form.

12. The method of claim 11, further comprising:
joining the probe shaft to the specimen assembly form by applying pressure to the probe shaft and the specimen assembly form; and,
separating the specimen assembly form from the coupon.

13. The method of claim 12 further comprising:
after the specimen assembly form is separated from the coupon, breaking the specimen assembly form at an area of weakness in the specimen assembly form.

14. A specimen assembly for atom probe analysis, the specimen assembly constructed according to the method of claim 13.

15. The method of claim 11, further comprising:
joining the probe shaft to the specimen assembly form by applying pressure to the probe shaft and the specimen assembly form; and,
breaking the specimen form at an area of weakness in the specimen assembly form.

16. A specimen assembly for atom probe analysis, the specimen assembly constructed according to the method of claim 11.

17. A specimen assembly for atom probe analysis, the specimen assembly constructed according to the method of claim 1.

18. The specimen assembly for atom probe analysis of claim 17, where the rough specimen is sharpened near the region of interest sufficiently to permit atom probe analysis of the region of interest.

19. The specimen assembly for atom probe analysis of claim 17 where the specimen assembly form is made of soft copper.

20. The specimen assembly for atom probe analysis of claim 17, further comprising:
the rough specimen situated approximately at the geometrical center of the open area of the specimen assembly form.

21. The specimen assembly for atom probe analysis of claim 17, where the rough specimen comprises a particle having an aspect ratio greater than unity and at least one dimension smaller than approximately 100 nanometers.

22. The specimen assembly for atom probe analysis of claim 17, where the probe tip has a V shape.

23. The specimen assembly for atom probe analysis of claim 17, where the probe tip has a slot.

* * * * *